(12) United States Patent
Ermolayev et al.

(10) Patent No.: US 8,189,705 B2
(45) Date of Patent: May 29, 2012

(54) METHOD AND APPARATUS TO PERFORM EQUALIZATION AND DECODING FOR A COMMUNICATION SYSTEM

(75) Inventors: Viktor Ermolayev, Nizhny Novgorod (RU); Alexey Khoryaev, Dzerzhinsk (RU); Ali Sadri, San Diego, CA (US); Roman Maslennikov, Nizhny Novgorod (RU); Alexander Maltsev, Nizhny Novgorod (RU)

(73) Assignee: Intel Corporation, Santa Clara, CA (US)

( * ) Notice: Subject to any disclaimer, the term of this patent is extended or adjusted under 35 U.S.C. 154(b) by 683 days.

(21) Appl. No.: 11/719,192

(22) PCT Filed: Nov. 12, 2004

(86) PCT No.: PCT/RU2004/000450
§ 371 (c)(1),
(2), (4) Date: Aug. 3, 2009

(87) PCT Pub. No.: WO2006/052156
PCT Pub. Date: May 18, 2006

(65) Prior Publication Data
US 2009/0296802 A1 Dec. 3, 2009

(51) Int. Cl.
*H04B 7/02* (2006.01)

(52) U.S. Cl. ........ 375/267; 375/232; 375/233; 375/260; 375/262; 375/340; 375/343; 375/346

(58) Field of Classification Search ................. 375/233, 375/260, 267; 455/132, 504
See application file for complete search history.

(56) References Cited

U.S. PATENT DOCUMENTS

| | | | | |
|---|---|---|---|---|
| 5,031,194 A * | 7/1991 | Crespo et al. | ................. | 375/233 |
| 5,852,630 A * | 12/1998 | Langberg et al. | ............. | 375/219 |
| 7,020,212 B1 * | 3/2006 | Strait | ................. | 375/260 |
| 7,212,566 B2 * | 5/2007 | Zhang et al. | ................. | 375/229 |
| 7,277,481 B2 * | 10/2007 | Tan et al. | ................. | 375/233 |
| 7,418,034 B2 * | 8/2008 | Xia et al. | ................. | 375/233 |
| 7,668,086 B2 * | 2/2010 | Caldwell et al. | ............. | 370/230 |

* cited by examiner

*Primary Examiner* — Dhaval Patel
(74) *Attorney, Agent, or Firm* — Kacvinsky Daisak, PLLC (57) ABSTRACT

A method and apparatus to perform equalization and decoding for a communication system are described. The embodiments may be directed to a method and apparatus to equalize a first signal and decode a second signal. In an embodiment, the second signal may include comparing the second signal with an output signal of a first feedback module. The decoded second signal may be compensated using a second feedback module. An output signal of the second feedback module may be compared with the equalized first signal to calculate the second signal.

11 Claims, 5 Drawing Sheets

METHOD AND APPARATUS TO PERFORM EQUALIZATION AND DECODING FOR A COMMUNICATION SYSTEM

BACKGROUND

A multiple input multiple output (MIMO) system may involve treating a plurality of communications media as a single communication channel. For example, a MIMO system may treat a plurality of individual twisted-pair copper wires bundled into a single cable as a single communications channel having multiple inputs and multiple outputs. Information transmitted over a given copper wire, however, may be susceptible to interference from information transmitted over an adjacent copper wire. This condition is typically referred to as "crosstalk."

The performance of a MIMO system may be significantly increased by reducing the amount of crosstalk in the MIMO channel. One technique to assist in reducing crosstalk is to perform channel equalization and decoding of the MIMO channel. Improved channel equalization and decoding may result in improved performance of the MIMO system. Consequently, there may be a need for improvements in such techniques in a device or network.

DETAILED DESCRIPTION

The embodiments may be directed to a method and apparatus to perform channel equalization and decoding of a multiple input multiple output (MIMO) channel for a communication system. The channel equalization and decoding technique may be used, for example, to suppress crosstalk in a communication system utilizing a full duplex communications medium such as copper wire twisted pairs, radio-frequencies (RF), and other media. Examples of crosstalk may include near end crosstalk (NEXT) and far end crosstalk (FEXT). In one embodiment, for example, the channel equalization and decoding technique may be performed simultaneously in a MIMO full duplex wired or wireless communication system using either inter-symbol interference (ISI) or non-ISI channels to provide joint multi-channel equalization, FEXT cancellation, and trellis decoding.

In one embodiment, the channel equalization and decoding technique provides a scheme for simultaneous equalization, FEXT cancellation, and decoding of trellis-coded modulation. In one embodiment, the channel equalization and decoding technique provides a scheme for simultaneous equalization, FEXT cancellation, and decoding of trellis-coded modulation for 10GBase-T communication system For example, the channel equalization and decoding technique may be used for a 10GBase-T communication system using baseband pulse amplitude modulated (PAM) transmission over 4-pair unshielded twisted pair (UTP) cable, similar to a 1000Bsse-T communication system. Although in 1000Base-T devices FEXT cancellation may be optional because the required SNR may be achieved without FEXT cancellation, in 10GBase-T systems, significant FEXT cancellation may be required to achieve the necessary SNR at the decoder. In one embodiment, the FEXT cancellation in a 10GBase-T system may be achieved using a MIMO decision feedback equalizer-decoder technique.

Decision feedback equalization (DFE) and trellis decoding generally may not be performed independently. This is due in part to the phenomena of error propagation in DFE, which may impact the performance of the decoder by significantly decreasing coding gain. In one embodiment, however, a decision feedback equalizer-decoder to a MIMO channel may be implemented jointly with a decoder and equalizer to provide joint multi-channel equalization, FEXT cancellation, and trellis decoding of the MIMO channel, for example.

In one embodiment, decision feedback equalization of the MIMO channel response may be performed using two feedback loops. A first feedback loop internal to the decoder and a second feedback loop external to the decoder. The first feedback loop may include a MIMO parallel decision feedback decoder to compensate for short-term MIMO channel response for time delays less than the length of a corresponding symbol of a Viterbi algorithm survivor path $N_V$. The second (external) feedback loop may include a feedback filter to compensate for long-term MIMO channel response for time delays between $N_V$ to $N_b$, where $N_b$ is approximately equal to the response delay of the MIMO channel. Utilization of the first (internal) and second (external) feedback loops may provide a practical MIMO system communication scheme having overall reduced complexity without degrading the MIMO channel's performance. This implementation may provide joint multi-channel equalization, FEXT cancellation, and trellis decoding of the MIMO channel, for example.

Figure 1:
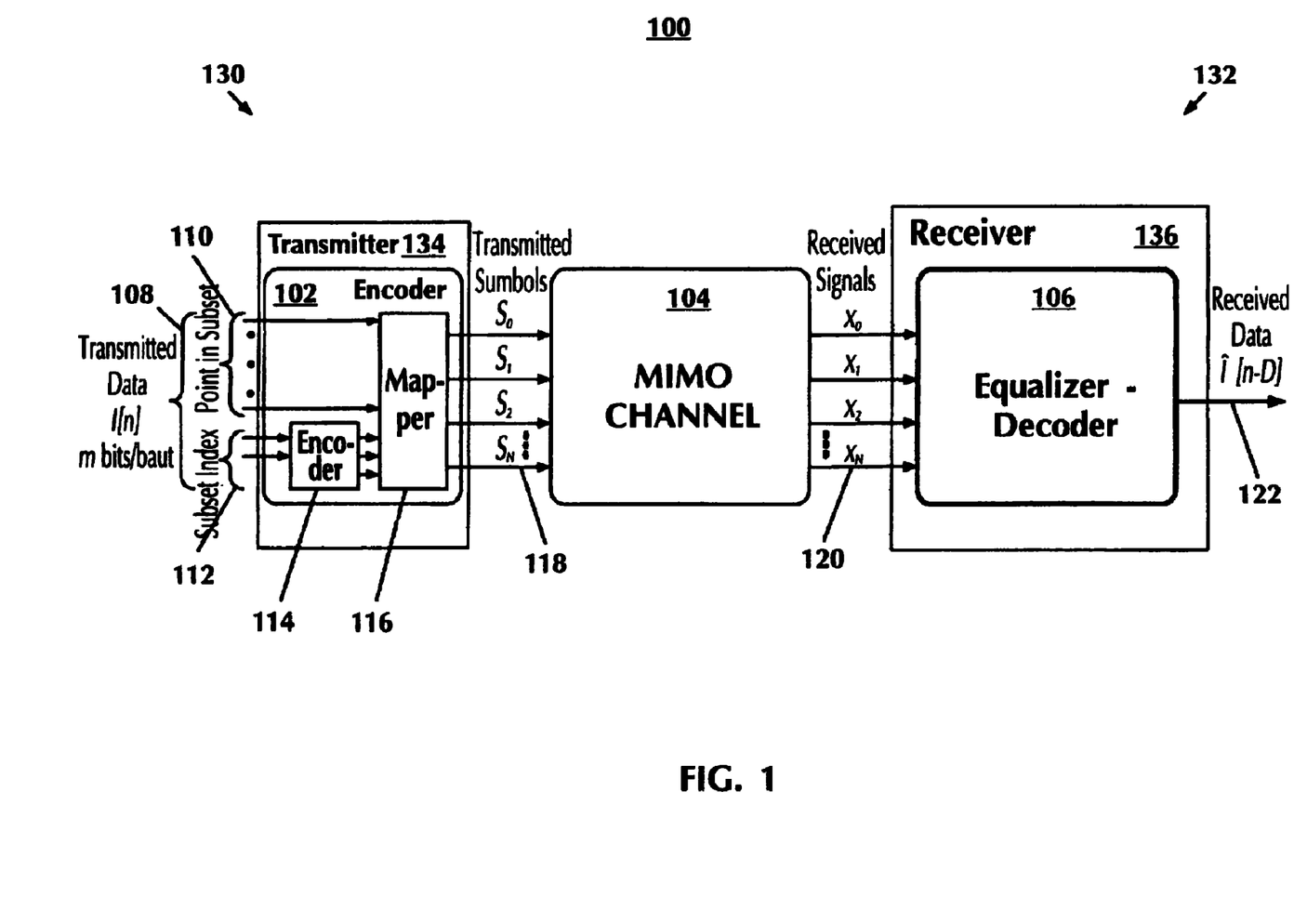
FIG. 1 illustrates a MIMO system suitable for practicing one embodiment.

FIG. 1 is a block diagram of a system 100. The system 100 may comprise a plurality of network nodes. The term "network node" as used herein may refer to any node capable of communicating information in accordance with one or more protocols. Examples of network nodes may include a computer, server, switch, router, bridge, gateway, personal digital assistant, mobile device, call terminal, and so forth. The term "protocol" as used herein may refer to a set of instructions to control how the information is communicated over the communications medium.

In one embodiment, the system 100 may communicate various types of information between the various network nodes. For example, one type of information may comprise "media information." Media information may refer to any data representing content meant for a user. Examples of content may include, for example, data from a voice conversation, videoconference, streaming video, electronic mail ("email") message, voice mail message, alphanumeric symbols, graphics, image, video, text, and so forth. Data from a voice conversation may be, for example, speech information, silence periods, background noise, comfort noise, tones, and so forth. Another type of information may comprise "control information." Control information may refer to any data representing commands, instructions or control words meant for an automated system. For example, control information may be used to route media information through a network, or instruct a network node to process the media information in a predetermined manner. Both the media and control information may be communicated in a data stream between two or more endpoints. The term "data stream" as used herein may refer to a collection of bits, bytes or symbols sent in series during a data communication session.

In one embodiment, one or more communications media may connect the network nodes. The term "communications media" as used herein may refer to any medium capable of carrying information signals. Examples of communications media may include metal leads, semiconductor material, twisted-pair wire, co-axial cable, fiber optic, RF spectrum, and so forth. The terms "connection" or "interconnection," and variations thereof, in this context may refer to physical connections, logical connections, wired connections, and/or wireless connections.

In one embodiment, for example, the network nodes may be connected by communications media comprising RIF spectrum for a wireless network, such as a cellular or mobile system. In this case, the network nodes and/or networks shown in the system 100 may further comprise the devices and interfaces to convert the signals carried from a wired communications medium to RF signals. Examples of such devices and interfaces may include omni-directional antennas and wireless RF transceivers. The embodiments, however, are not limited in this context.

In one embodiment, the network nodes may communicate information to each other in the form of packets. A packet in this context may refer to a set of information of a limited length, where the length generally is represented in terms of bits or bytes. An example of a packet length might be 1000 bytes. The packets may be communicated in accordance with one or more packet protocols. For example, in one embodiment the packet protocols may include one or more Internet protocols, such as the Transmission Control Protocol (TCP) and Internet Protocol (IP). The embodiments, however, are not limited in this context.

Referring again to FIG. 1, the communication system 100 may comprise a wired or wireless communication system using a MIMO communication channel. In one embodiment, for example, the system 100 may comprise a local area network (LAN) operating in accordance with one or more Ethernet based communication protocols as defined by the Institute for Electrical and Electronic Engineers (IEEE) 802.3 series of standards, such as a Gigabit Ethernet 1000Base-T communication system, an advanced 10GBase-T communication system, and so forth. Although one embodiment may be illustrated in the context of a 10GBase-T system by way of example, it can be appreciated that any type of communication system employing a MIMO communication channel may be used and still fall within the intended scope of the embodiments.

FIG. 1 may illustrate the structure of the communication system 100. As shown in FIG. 1, the communication system 100 may comprise first and second network nodes 130 and 132, respectively. The first and second network nodes 130, 132 each may represent processing systems having a physical layer entity (PHY) arranged to operate in accordance with 10GBase-T as defined by the IEEE 802.3 an series of standards, for example. The 10GBase-T PHY may interface with, for example, a 10G media access control (MAC) and Gigabit Media Independent Interface (XGMII) in the IEEE architecture. The 10GBase-T PHY may comprise part of a Network Interface Card (NIC), for example. Nodes 130, 132 may comprise any processing system and/or communications device suitable for use with a 10GBase-T device, such as any of the nodes as previously described. For example, nodes 130, 132 may be implemented as a pair of switches, a pair of routers, a pair of servers, a switch and a router, a switch and a server, a server and a router, and so forth. In addition, nodes 130, 132 also may be part of a modular system in which 10GBase-T is the high-speed connection for the system. Further examples for nodes 130, 132 may include high-end servers, supercomputers, clusters, grid computing, workgroup switch uplinks, aggregation uplinks, storage systems, and so forth. Each of the nodes 130, 132 may include, for example, a host system and other functional components. In one embodiment, the host system may include one or more computer platforms (e.g., chipsets, motherboard, and the like) to provide intercommunication between the host system and/or other functional components and the receiver 136. In one embodiment, the receiver 136 may be a 10GBase-T receiver, for example. The embodiments are not limited in this context.

More particularly, the first network node 130 may comprise an encoder 102 module and the second network node 132 may comprise an equalizer-decoder 106 module, for example. The first and second network nodes 130, 132 may communicate information between each other via a MIMO channel 104, for example. For purposes of clarity, FIG. 1 shows two network nodes 130, 132 and one MIMO channel 104, nevertheless, those skilled in the art will appreciate that any number of network nodes and MIMO channels may be used and still fall within the scope of the embodiments.

The communication system 100 may operate to communicate information between the first and second network nodes 130, 132 at communication speeds of approximately 10 Gigabits per second (Gbps). The 10 Gbps rate may comprise full duplex data throughput and may be achieved using the MIMO channel 104. In one embodiment, the MIMO channel 104 may comprise, for example, four pairs of twisted pair coppers wires bundled in a Category 5 (CAT-5) cable. Each pair may transmit a 2500 Megabits per second (Mbps) data stream encoded into a 4-dimension (4-D) 5-level pulse amplitude modulation (PAM-5) signal constellation as well as 4-D 10-level (PAM-10) and 20-level (PAM-20) signal constellations, for example. Generally, the four pairs of CAT-5 unshielded twisted pair (UTP) wiring connections may be treated as one channel having four inputs and four outputs, for example. Hence, each network node 130, 132 may contain four similar transceivers (not shown), one for each pair of physical wire. For example, each of the transmitters (not shown) of each transceiver may be paired with a corresponding receiver (not shown) of each transceiver. Hybrid circuits (not shown) also may be provided to facilitate bidirectional data transmission on the same wire.

In one embodiment, the encoder 102 module may be configured to receive information symbols 108, represented by I[n], to be communicated between the first network node 130 and the second network node 132, for example. The information symbols 108 may comprise m bits of information, for example. The m bits may be provided to the encoder 102 module during a baud interval, for example. In one embodiment, the encoder 102 module may comprise a trellis encoder using a multi-state code across the MIMO channel 104. In one embodiment, the trellis encoder may use a 4-D eight state trellis code across pairs of UTP cables, for example. The number of m bits transmitted during each baud interval depends on the baud rate (m bits×baud rate=10 Gbps), for example. The number of m bits also may define the required number of levels to implement a particular pulse amplitude modulation (PAM) scheme (e.g., PAM-5, PAM-10, PAM-20, and so forth). Several examples of PAM schemes and the required number of m bits at specific baud rates are shown in Table 1 below. Those skilled in the art will appreciate, however, that the embodiments are not necessarily limited in this context.

TABLE 1

| m | Baud rate | Modulation |
|---|---|---|
| 8 | 1250 MHz | PAM5 |
| 12 | 833 MHz | PAM10 |
| 16 | 625 | PAM20 |

The encoder 102 module may comprise a subset encoder 114 to select a number of signal subsets from a given signal constellation. The encoder 102 module also may comprise a symbol mapper 116, for example. In one embodiment, one or more of the m bits comprising each information symbol 108 may form a subset index 112 that may be used as inputs to the subset encoder 114 to select one of a plurality of signal subsets from the signal constellation, for example. In one embodiment the subset encoder 114 may be a ⅔ convolutional encoder, for example, where two of the m bits may be provided to the ⅔ convolutional encoder to select one of eight signal subsets from the signal constellation, for example. It will be appreciated, however, that the embodiments are not necessarily limited in this context as the size of the subset index 112 depends on the particular modulation scheme implemented in the communication system 100. The remaining uncoded m bits may form a point in subset 110 to select one of a plurality of symbols 118,S=[$S_0,S_1,S_2, \ldots S_N$] to be transferred between the first network node 130 and the second network node 132 within a chosen subset selected by the encoder 114, where N is the number of connections in the communications medium comprising the MIMO channel 104. For example, in one embodiment, where two of the m bits are used as inputs to the ⅔ convolutional encoder 114, the other uncoded "m-2" bits may be used to select one 4-D symbol S=[$S_0,S_1,S_2,S_3$] within the chosen subset. The selected 4-D symbol then may be transferred over the MIMO channel 104. In one embodiment the selected 4-D symbol may be transferred over four pairs of UTP cable, for example.

In one embodiment, the plurality of symbols 118 S=[$S_0, S_1,S_2, \ldots S_N$] may be transmitted from the first network node 130 to the second network node 132 over various connections forming the communication medium in the MIMO channel 104 (e.g., four pairs of UTP cable). The plurality of symbols 118 S=[$S_0,S_1,S_2, \ldots S_N$] propagate from one or more transmitters 134 in the first network node 130 to corresponding one or more receivers 136 in the second network node 132. For example, in one embodiment, the MIMO channel 104 comprises four twisted pairs of UTP cable as the communication medium. Thus, the communication system 100 may comprise four transmitters 134 at the first network node 130 and four corresponding receivers 136 at the second network node 132. The signals propagating along one of the four twisted pairs also may be coupled to the remaining three twisted pairs such that all the transmitted signals may be presented to each corresponding receiver, for example. Accordingly, each of the transmitted signals may be present at all receivers.

The transmission of these signals over the MEMO channel 104 comprising the four twisted pair UTP cable, for example, may be described by an equivalent discrete-time model comprising a multidimensional (e.g., 4×4) linear filter with the addition of noise signals that may be present in a MIMO channel. In accordance with the equivalent discrete-time model, the output signals 120 emerging from the MIMO channel 104 at time instant n may be defined in accordance with equation (1), for example, as:

$$x_i(n) = \sum_{j=0}^{3}\sum_{k=0}^{L-1} S_j(n-k)h_{ij}(k) + v_i(n) \quad i = 0, \ldots, 3 \qquad 1)$$

where $S_j$ are the symbols 108 transmitted from the first network node 130, $x_i$ are the MIMO channel 104 output signals at 120 received at the second network node 132, $h_{ij}$=[$h_{ij}(0) \ldots h_{ij}(L-1)$] is the impulse response of the MIMO channel 104 from the j-th transmitter to the i-th receiver, L is the maximum length of all impulse responses $h_{ij}$, and $v_i$ is an additive noise component that may be present in the MIMO channel 104, for example.

Still in one embodiment, the MIMO channel 104 output signals $x_i(n)$ at 120 may be communicated to the equalizer-decoder 106 module for equalization and decoding according to the embodiments. The equalizer-decoder 106 module processes the MIMO channel 104 output signals $x_i(n)$ and provides received data Î(n-D) at output port 122. It can be appreciated that the plurality of symbols 118 S=[$S_0,S_1,S_2, \ldots S_N$] transmitted from the first network node 130 may be delayed by D samples when they emerge from the output port 122 as received data Î(n-D). Although the equalizer-decoder 106 module may require the delay D in order to process the incoming signals $x_i(n)$, the various embodiments should not be limited in this context.

Figure 2:
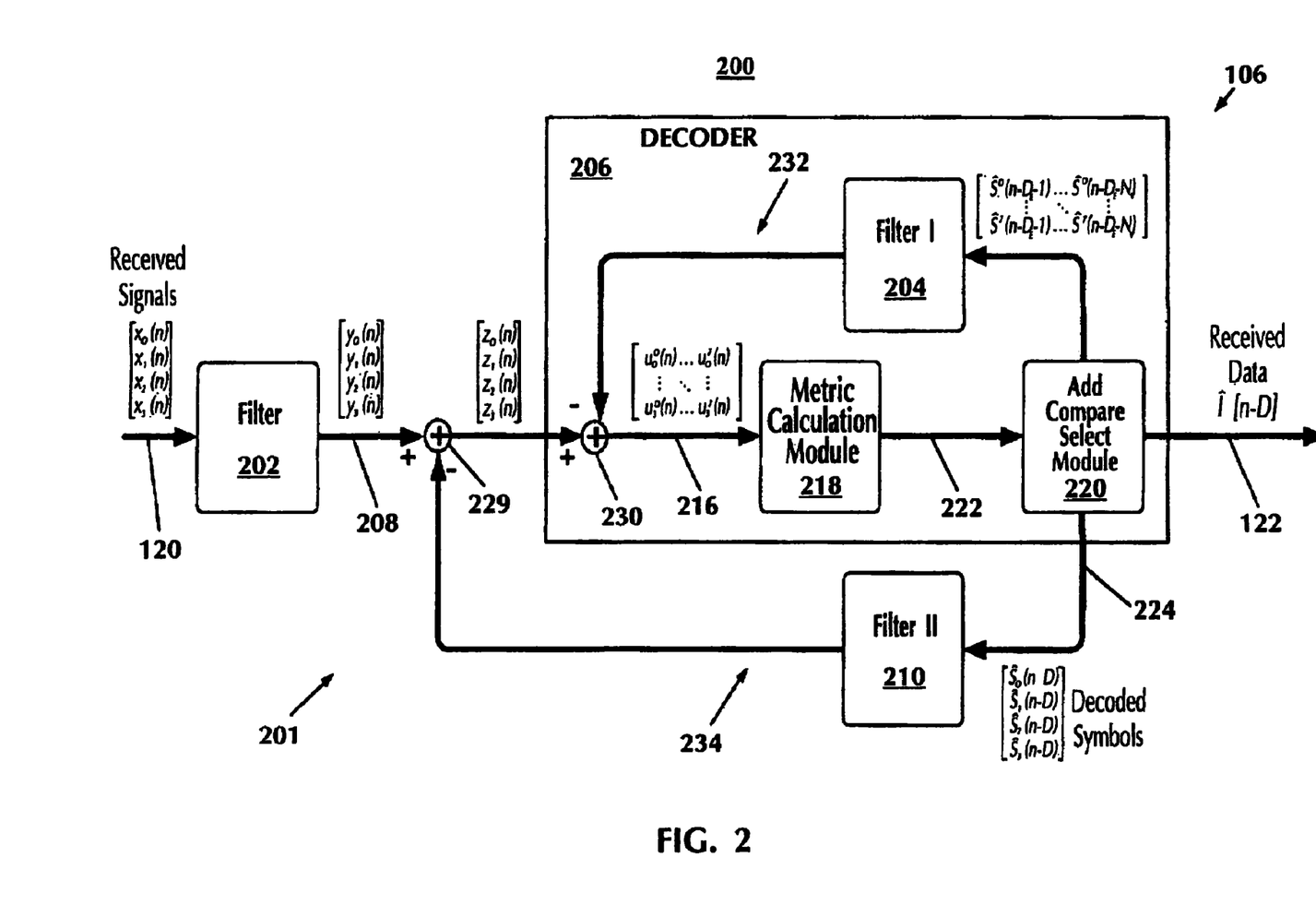
FIG. 2 illustrates a block diagram of a MIMO decision feedback equalizer and decoder in accordance with one embodiment.

FIG. 2 is a block diagram 200 that may illustrate the structure of one embodiment of the equalizer-decoder 106 module. In one embodiment, the equalizer-decoder 106 module may comprise a communication channel equalization portion 201 and a communication channel decoder 206 portion. The channel equalization portion 201 and the communication channel decoder 206 portion communicate via a first feedback loop 232 and a second feedback loop 234, for example, which is described in more detail below.

In one embodiment, the equalization portion 201 may comprise a multidimensional filter 202 module and a first subtractor 229 module. In one embodiment, the multidimensional filter 202 module may be a feedforward filter, for example. The first subtractor 229 module compares the output signals $y_i(n)$ from the feedforward filter 202 module and compensated decoded signals 212 from the decoder portion 206.

The decoder 206 portion of the equalizer-decoder 106 module may be a MIMO Parallel Decision Feedback Decoder (PDFD), although the various embodiments should not be limited in this context as other structures may be substituted therefor. The decoder 206 portion may comprise, for example, a first multidimensional feedback filter 204 module, a metrics calculation 218 module, an add/compare select (ACS) 220 module, and a second subtractor 230 module, which may be arranged as shown in FIG. 2, for example. In one embodiment, the first multidimensional feedback filter 204 module may be a MIMO feedback filter. The decoder 206 portion also may include the first feedback loop 232 comprising, for example, the first feedback filter 204 module to receive the symbols of the Viterbi algorithm survivor paths from the ACS 220 module and to provide the compensated survivor symbols to the second subtractor 230 module.

The equalizer-decoder 106 module also may comprise the second feedback loop 234 comprising, for example, a second feedback filter 210 module, which may be arranged as shown in FIG. 2. The second feedback filter 210 module compensates the decoded symbols received from the decoder 206 module. The compensated decoded symbols are then provided to the first subtractor 229. In one embodiment, the compensated decoded symbols may be provided to the first subtractor 229 substantially simultaneously while the compensated survivor symbols are provided to the second subtractor 230 module by the first feedback filter 204 module, for example. Thus, in one embodiment, equalizer-decoder 106 module may utilize the first and second feedback loops 232, 234 to jointly equalize and decode the signals communicated in the MIMO communication channel 104, for example.

Both the first and second feedback filter 204, 210 modules may be implemented with a similar impulse response characteristic, for example. The first feedback filter 204 module may use $[b_{ij}(1), \ldots, b_{ij}(N_v)]$ to compensate for postcursor ISI separately for each state of the decoder 206, where $N_v$ is the length of the Viterbi algorithm survivor path. The second feedback filter 210 module may use $[b_{ij}(N_v+1), \ldots, b_{ij}(N_B-1)]$ to compensate for postcursor ISI common to all the states of the decoder 206, where $N_B$ is the postcursor ISI impulse response. In one embodiment, for example, $N_v$ may be much shorter than $N_B$. In one embodiment, the second feedback filter 210 module may use the symbols of the Viterbi algorithm survivor paths to compensate for any remaining ISI separately for multiple states of the decoder 206.

In one embodiment, the signals $x_i(n)$ received at 120 may be provided to the multidimensional feedforward filter 202 module. In one embodiment, the multidimensional feedforward filter 202 module may partially compensate for the response function of the MIMO channel 104 (e.g., the poles of the MIMO channel 104 transfer function $h_{ij}$). In the MIMO channel 104 embodiments comprising four-pair UTP cable, the multidimensional feedforward filter 202 module may be implemented as a 4×4 feedforward filter, with characteristics in accordance with equation (2), for example:

$$y_i(n) = \sum_{j=0}^{3} \sum_{k=0}^{N_F-1} x_j(n-k) w_{ij}(k) \quad i = 0, \ldots, 3 \quad (2)$$

where $y_i(n)$ are the output signals at 208 of the multidimensional feedforward filter 202, $w_{ij}$ is the impulse response of the feedforward filter 202 module from the j-th input to the i-th output, and $N_F$ is the length of the feedforward filter 202 module. In one embodiment, the impulse response $w_{ij}$ of the feedforward filter 202 module may be chosen to be the same as the minimum mean square error (MMSE) of the MIMO decision feedback equalization response, for example. The decision delay of the feedforward filter 202 module may be represented by $D_F$ for example.

Once the output signals $x_i(n)$ at the input port 120 are, at least in part, equalized by the multidimensional feedforward filter 202 module, the postcursor intersymbol interference (ISI) cancellation and trellis decoding may be performed on the equalized output signals $y_i(n)$, for example. In one embodiment, the postcursor ISI may be compensated jointly by the decoder 206 and the first feedback filter 204 module, and the trellis decoding function may be performed by the decoder 206, for example. In one embodiment, the first feedback filter 204 module may be a multidimensional feedback filter to process survived symbols for all states of the decoder 206 to compensate for a short-term portion of the MIMO channel 104 impulse response function $w_{ij}$, for example. The decoder 206 may combine the equalization function with the trellis decoding function to provide simultaneous equalization, FEXT cancellation, and decoding of the trellis-coded modulation for the 10GBase-T, for example. In one embodiment, the trellis decoding function may be implemented, at least in part, by executing the Viterbi algorithm. As will be appreciated by those skilled in the art, the Viterbi algorithm is applied to a received sequence of signals in a communication channel and it finds the path along a corresponding trellis diagram with the desired metric (e.g., the maximum likelihood path). Accordingly, postcursor ISI may be cancelled for each code state separately by taking the symbols of the corresponding Viterbi algorithm survivor path as the feedback decisions inputs to the first feedback filter 204 module. The length of the Viterbi algorithm survivor path $N_v$ applied to the trellis decoding scheme may be defined by a convolutional coder, for example.

The decoder 206 also provides decoded symbols $S_j$, (n-D) at 224 to the second feedback filter 210 module. In one embodiment, the second feedback filter 210 module may be a multidimensional feedback filter to compensate for a long-term portion of the MIMO channel 104 impulse response function $w_{ij}$, for example. In one embodiment, the length of the survivor path $N_v$ may be selected to be much shorter than the postcursor ISI impulse response $N_b$ (e.g., $N_v \sim 10$ and $N_b \sim 100$). Thus, although the decoded symbols $S_i$(n-D) at 224 still may introduce some ISI into the detected symbols $S_i$(n - $D_F$), the portion of the postcursor ISI introduced by the detected symbols $S_i(n-D_F)$ may be compensated by the second feedback filter 210 module, for example. The second feedback filter 210 module may provide the compensated detected signals to the first subtractor 229, module where the compensated detected signals may be compared with the output signals $y_i(n)$ at 208.

The output 212 of the second feedback filter 210 may be subtracted from the output signals $y_i(n)$ at 208 by the first subtractor 229 module to provide $z_i(n)$ at 214. The $z_i(n)$ signals are the inputs to the decoder 206 and may be represented according to equation (3), for example, as:

$$z_i(n) = y_i - \sum_{j=0}^{3} \sum_{k=N_v+1}^{N_B-1} \hat{S}_j(n-k-D_F) b_{ij}(k) \quad i = 0, \ldots, 3 \quad (3)$$

where $\hat{S}_j(n)$ are the decoded symbols, and $b_{ij} = [b_{ij}(1), \ldots, b_{ij}(N_B-1)]$ is the impulse response characteristic of the second feedback filter 210 module.

The $z_i(n)$ signals output by the first subtractor 229 module are provided to the second subtractor 230 module 230. The $z_i(n)$ signals are then compared with the output signals of the first feedback filter 204 module by the second subtractor 230 module. The output of the second subtractor 230 module is $u^l_j(n)$ and this is the input to the metrics calculation 218 module. The $u^l_j(n)$ signals are ISI free and are available at 216 for multiple states of the decoder 206. For example, in one embodiment, at the input to the metric calculation 218 module there may be eight 4-D ISI free signals $u^l_j(n)$ available at 216 for eight states of the decoder 206.

In one embodiment, the metric calculation 218 module calculates metrics for all possible coder transitions and selects 4-D symbols corresponding to these transitions, for example. As discussed previously, "metrics" in this context may refer to the maximum likelihood path of the decoder 206. The signals $u^l_j(n)$ at the input to the metric calculation 218 module may be represented for the eight states of the decoder 206 in accordance with equation 4, for example:

$$u_j^l(n) = z_i - \sum_{j=0}^{3} \sum_{k=1}^{N_V} \hat{S}_j^l(n-k-D_F)b_{ij}(k) \quad (4)$$

$$i = 0, \ldots, 3 \; l = 0, \ldots, 7$$

Where j is the number of pair, l is the code state number, and $\hat{S}_j^l(n)$, are symbols of the Viterbi algorithm survivor paths.

In one embodiment, the metric calculation unit 218 also may calculate 4-D metrics for 32 possible transitions of the decoder 206 (e.g., four allowed transitions for each one of the eight code states) and may acquire 4-D symbols corresponding to these transitions. These operations may be performed in 10BASE-T in a similar manner to the operations performed in 1000BASE-T, for example, with more possible levels of PAM modulation.

The calculated metrics and corresponding symbols may be provided to the ACS 220 module, for example, at 222. In one embodiment, the ACS 220 module may update the coder states, may make final decisions, and also may provide the received data I(n-D), for example, at output port 122. The ACS 220 module also may perform an inverse mapping of the decoded symbols [$S_0, S_1, S_2, \ldots S_N$] leaving the decoder 206 and may provide the decoded symbols [$S_0, S_1, S_2, \ldots S_N$] to the second feedback filter 210 module at 224, for compensation. The ACS 220 module also may provide the received data Î(n-D) at output 122, for example. After updating the states of the decoder 206, the ACS 220 module also may provide the symbols of the Viterbi algorithm survivor paths to the first feedback filter 204 module along with the survivor paths of 4-D symbols. The symbols of the Viterbi algorithm survivor paths may be represented in matrix (5), for example, as:

$$\begin{bmatrix} \hat{S}^0(n-D_F-1) & \ldots & \hat{S}^0(n-D_F-N_v) \\ \vdots & & \vdots \\ \hat{S}^7(n-D_F-1) & \ldots & \hat{S}^7(n-D_F-N_v) \end{bmatrix} \quad (5)$$

As discussed previously, the output of the first feedback filter 204 module is provided to the second subtractor 230 module, where the output signals are compared with the $z_i(n)$ signals from the first subtractor 229 module. As discussed previously, the resulting signals $u_j^l(n)$ become the inputs to the metric calculation 218 module.

Figure 3:
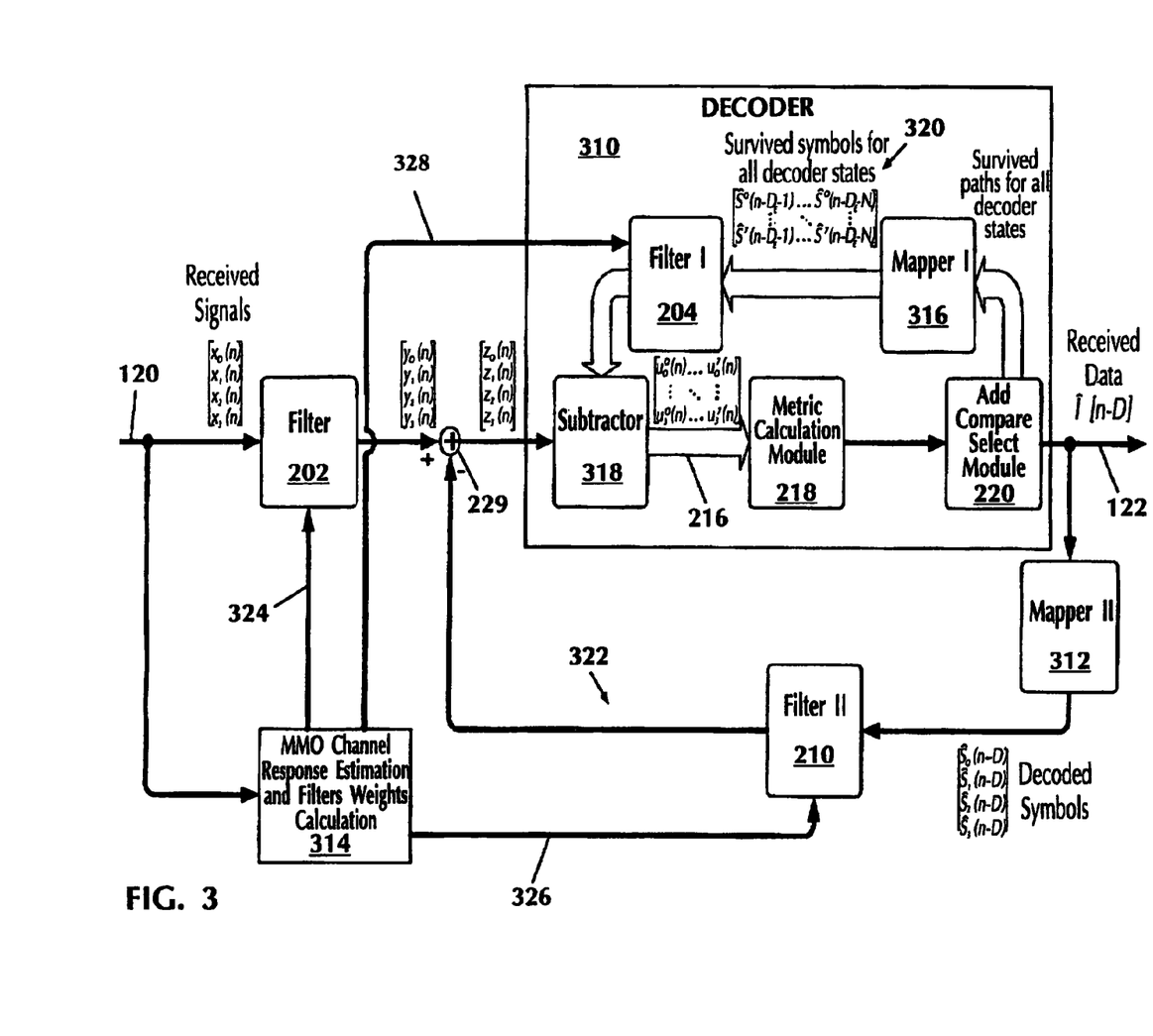
FIG. 3 illustrates MIMO decision feedback equalizer and decoder in accordance with one embodiment.

FIG. 3 is a block diagram 300 that may illustrate the structure of one embodiment of the equalizer-decoder 106 module. The equalizer-decoder 106 module may comprise, for example, a first feedback loop 320 and a second feedback loop 322. The equalizer-decoder 106 module also may comprise, for example, the feedforward filter 202 module, the first feedback filter 204 module, a decoder 310 module, a first mapper 312 module, and a MIMO channel response estimation and filters weights calculation 314 module, which may be arranged as shown in FIG. 3, for example. In one embodiment, the first feedback filter 204 module may be a MIMO feedback filter and the decoder 310 module may be a MIMO Parallel Decision Feedback Decoder (PDFD), although the embodiments should not be limited in this context as other structures may be substituted therefor. In one embodiment, the decoder 310 module may comprise, for example, a second feedback filter 210 module, a metric calculation 218 module, an ACS 220 module, a second mapper 316 module, and a subtractor 318 module, which may be arranged as shown in FIG. 3, for example.

Having previously explained the functions of the feedforward filter 202 module, the first feedback filter 204 module, the second feedback filter 210 module, the metric calculation 218 module, and the ACS 220 module, for clarity, the following description of the block diagram 300 will be limited to the explanation of the decoder 310 module, the first and second mapper 312, 316 modules, the MEMO channel response estimation and filters weights calculation 314 module, and the subtractor 318 module.

Accordingly, the second mapper 316 module maps the symbols of the Viterbi algorithm survivor paths from the ACS 220 module to $N_V$ sets of multiple symbols for each state of the decoder 310 module, for example. In one embodiment, the multiple symbols are mapped to $N_V$ sets of 4-D symbols, for example. The subtractor 318 module subtracts the symbols of the Viterbi algorithm survivor paths for all states of the decoder 310 module filtered by the first feedback filter 204 module from the 4-D signal $z_{i(n)}$, which may be processed via the first feedback loop 320. The output 216 of the subtractor 318 module may represent, for example, a 4-D equalized signal $u_j^l(n)$ for every state of the decoder 310 module. The first mapper 312 module maps the finally decoded output data Î(n-D) at the output port 122 to 4-D symbols, which may be provided to the first feedback loop 320. The MIMO channel response estimation and filters weights calculation 314 module may be used to determine the optimal weights for all three filters 202, 204, 210 and provides optimized weights to the feedforward estimation filter 202 module at 324, the first feedback filter 204 module at 326, and the second feedback filter 210 module at 328. The MIMO channel response estimation and filters weights calculation 314 module also may be used initially as a training stage during which estimates of the response functions of the MIMO channel 104 may be generated, for example. In one embodiment, on the basis of these estimates, the MIMO channel response estimation and filters weights calculation 314 module may calculate the optimal filter weights using a minimum-mean-square-error (MMSE) criterion technique, for example.

Figure 4:
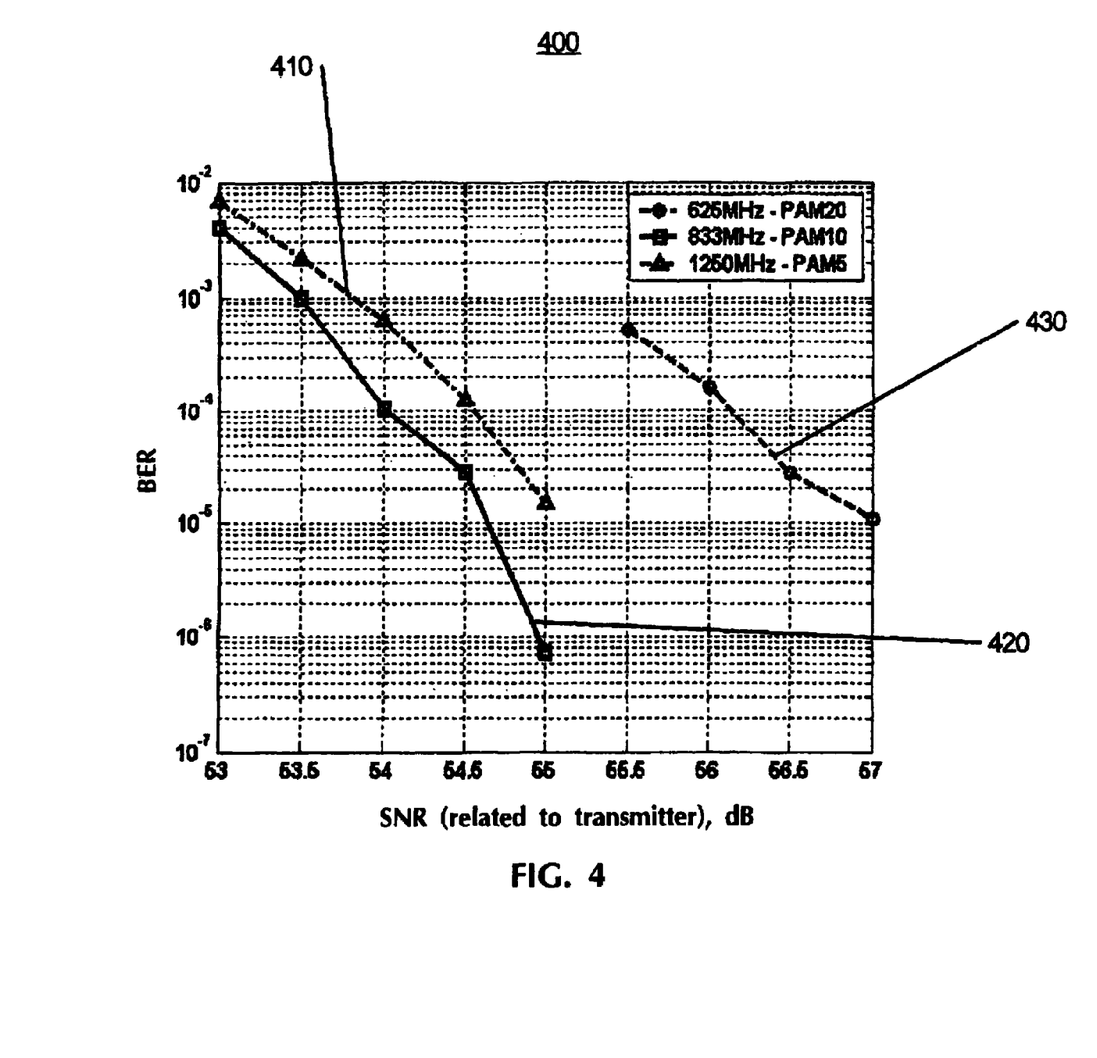
FIG. 4 is a graph illustrating the performance of a MIMO system according to one embodiment.

FIG. 4 is a graph 400 illustrating the performance of a MIMO communication system 100, for example. The graph 400 shows the results of one example of a simulation of the equalizer-decoder 106 for three modulations schemes: (1) PAM5 at 1250 MHz shown by curve 410; (2) PAM10 at 833 MHz shown by curve 420, and (3) PAM20 at 625 MHz shown by curve 430. These modulation schemes may correspond to baud rates for Category 6 UTP Cable, for example. The curves 410, 420, 430 represent the bit error rate (BER) with respect to signal to noise ratios (SNR), in dB, related to the transmitter.

Operations for the above system and subsystem may be further described with reference to the following figures and accompanying examples. Some of the figures may include programming logic. Although such figures presented herein may include a particular programming logic, it can be appreciated that the programming logic merely provides an example of how the general functionality described herein can be implemented. Further, the given programming logic does not necessarily have to be executed in the order presented unless otherwise indicated. In addition, the given programming logic may be implemented by a hardware element, a software element executed by a processor, or any combination thereof. The embodiments are not limited in this context.

Figure 5:
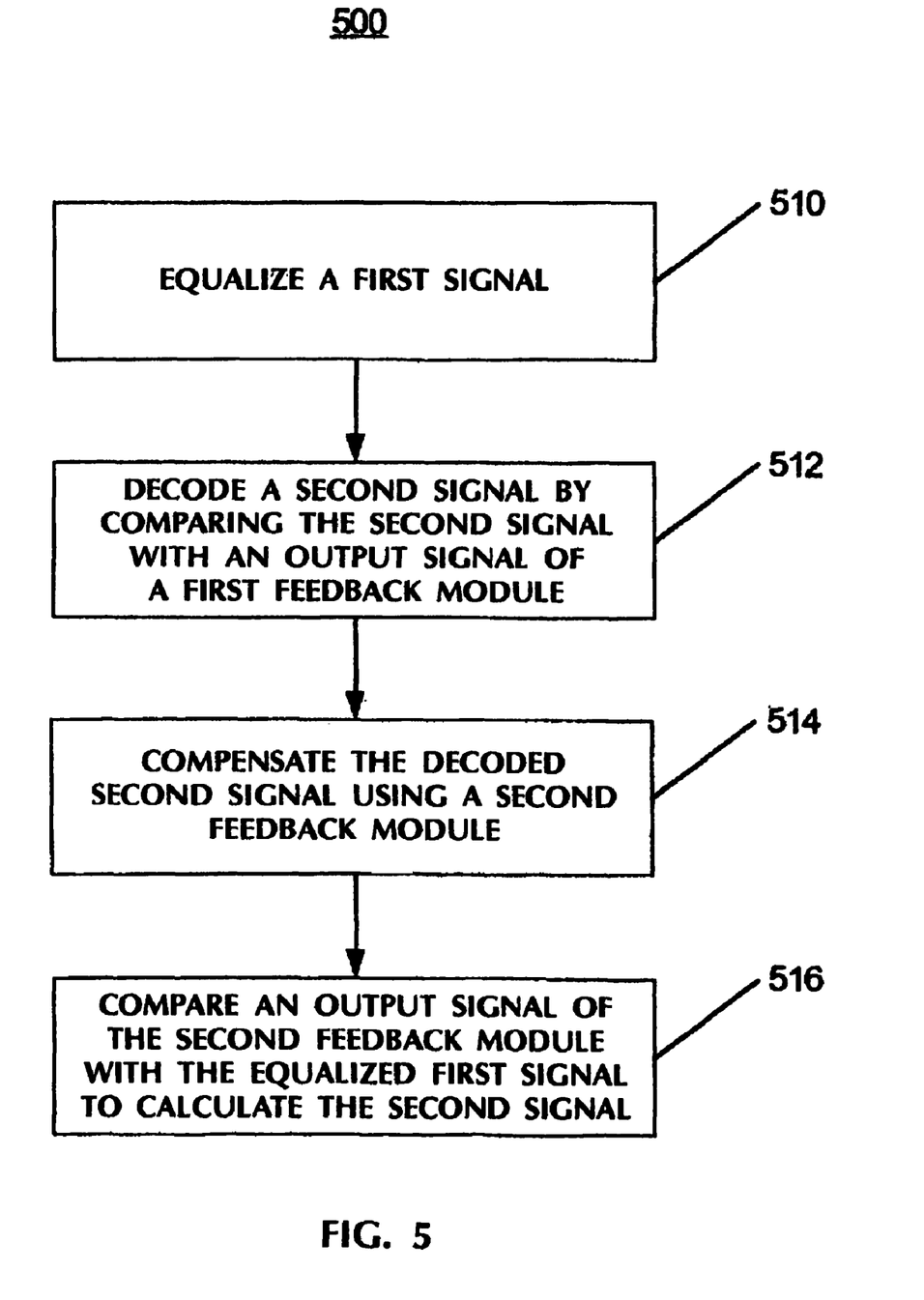
FIG. 5 is a block flow diagram of a programming logic in accordance with one embodiment.

FIG. 5 illustrates a programming logic 500. Programming logic 500 may be representative of the operations executed by one or more systems described herein. As shown in programming logic 500 at block 510, the system equalizes a first signal. Equalizing a first signal may comprise, for example, receiving the first signal from a communication channel and filtering the first signal using a feedforward filter. In one embodiment, the programming logic, filters the first signal according to equation (6):

$$y_i(n) = \sum_{j=0}^{N} \sum_{k=0}^{N_F-1} x_j(n-k) w_{ij}(k) \quad i = 0, \ldots, N \quad (6)$$

where $x_j(n-k)$ is said input signal, $y_i(n)$ is an output signal of said feedforward filter, $w_{ij}$ is an impulse response of said feedforward filter from a j-th input to an i-th output, $N_F$ is a length of said feedforward filter, and N is a number of communications media in said communication channel, for example.

At block 512, the system decodes a second signal. In decoding the second signal, the system may compare the second signal with an output signal of a first feedback module. Further, decoding the second signal also may comprise, for example, calculating metrics corresponding to coder transitions and selecting a plurality of symbols corresponding to said transitions. Decoding the second signal also may comprise, for example, updating coder states, providing a plurality of symbols survivor paths to a mapper module, mapping the survivor paths to a plurality of sets of the plurality of the symbols, and providing the symbols survivor paths to the first feedback module. In addition, decoding the second signal also may comprise, for example, processing a plurality of survived symbols for a plurality of decoder states using the first feedback module to compensate for a short-term portion of a communication channel response function. In one embodiment, the first feedback module may comprise an impulse response characteristic defined by:

$$[b_{ij}(1), \ldots, b_{ij}(N_v)] \quad (7)$$

where $N_v$ is a length of a Viterbi algorithm survivor path, for example.

At block 514, the system compensates the decoded second signal using a second feedback module. In one embodiment, compensating the decoded second signal using a second feedback module may comprise, for example, compensating for a long term portion of a communication channel response function. In one embodiment, the second feedback module may comprise an impulse response characteristic defined by:

$$[b_{ij}(N_v+1), \ldots, b_{ij}(N_B-1)] \quad (8)$$

where $N_v$ is a length of a Viterbi algorithm survivor path and wherein $N_B$ is a postcursor ISI impulse response, for example.

And, at block 516, the system compares an output signal of the second feedback module with the equalized first signal to calculate said second signal. In one embodiment, comparing an output signal of the second feedback module with the equalized first signal to calculate the second signal may comprise, for example, subtracting an output signal of the second feedback module from the equalized first signal and calculating the second signal according to the following equation:

$$z_i(n) = y_i - \sum_{j=0}^{N} \sum_{k=N_v+1}^{N_B-1} \hat{S}_j(n-k-D_F) b_{ij}(k) \quad i = 0, \ldots, N \quad (9)$$

where $\hat{S}_j(n)$ represents decoded second signals, $b_{ij}=[b_{ij}(1), \ldots, b_{ij}(N_B-1)]$ is the impulse response characteristic of the second feedback module, $y_i$ is an equalized first signal, and N is a number of communications media in a communication channel, for example. In one embodiment, comparing the second signal with an output signal of a first feedback module comprises an output signal defined according to the following equation:

$$u_j^l(n) = z_i - \sum_{j=0}^{N} \sum_{k=1}^{N_v} \hat{S}_j^l(n-k-D_F) b_{ij}(k) \quad (10)$$

$$i = 0, \ldots, N \quad l = 0, \ldots, L$$

where j is a number of pair, l is a code state number, N is a number of communications media in a communication channel, and $\hat{S}_j^l(n)$ are symbols of a Viterbi algorithm survivor paths, for example.

Numerous specific details may be set forth herein to provide a thorough understanding of the embodiments of the invention. It will be understood by those skilled in the art, however, that the embodiments of the invention may be practiced without these specific details. In other instances, well-known methods, procedures, components and circuits have not been described in detail so as not to obscure the embodiments of the invention. It can be appreciated that the specific structural and functional details disclosed herein may be representative and do not necessarily limit the scope of the invention.

It is worthy to note that any reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Furthermore, although the embodiments may be described by way of example as comprising one or more modules, it can be appreciated that a greater or lesser number of modules may be used and still fall within the scope of the embodiments. Further, although the embodiment may be described in terms of "modules" to facilitate description, one or more circuits, components, registers, processors, software subroutines, or any combination thereof could be substituted for one, several, or all of the modules.

The embodiments may be implemented using an architecture that may vary in accordance with any number of factors, such as desired computational rate, power levels, heat tolerances, processing cycle budget, input data rates, output data rates, memory resources, data bus speeds and other performance constraints. For example, one embodiment may be implemented using software executed by a processor. The processor may be a general-purpose or dedicated processor, such as a processor made by Intel® Corporation, for example. The software may comprise computer program code segments, programming logic, instructions or data. The software may be stored on a medium accessible by a machine, computer or other processing system. Examples of acceptable media may include computer-readable media such as read-only memory (ROM), random-access memory (RAM), Programmable ROM (PROM), Erasable PROM (EPROM), magnetic disk, optical disk, and so forth. In one embodiment, the medium may store programming instructions in a compressed and/or encrypted format, as well as instructions that may have to be compiled or installed by an installer before being executed by the processor. In another example, one embodiment may be implemented as dedicated hardware, such as an Application Specific Integrated Circuit (ASIC), Programmable Logic Device (PLD) or Digital Signal Processor (DSP) and accompanying hardware structures. In yet another example, one embodiment may be implemented by any combination of programmed general-purpose computer components and custom hardware components. The embodiments are not limited in this context.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true scope of the embodiments of the invention.

The invention claimed is:

1. A method, comprising:
    equalizing a first signal, the equalizing a first signal comprises:
        receiving said first signal from a communication channel, and
        filtering said first signal using a feedforward filter, the filtering said first signal comprises:
            filtering said first signal according to the following equation:

$$y_i(n) = \sum_{j=0}^{N} \sum_{k=0}^{N_F-1} x_j(n-k)w_{ij}(k) \ i = 0, \ldots, N$$

wherein $x_j(n-k)$ is said input signal, $y_i(n)$ is an output signal of said feedforward filter, $w_{ij}$ is an impulse response of said feedforward filter from a j-th input to an i-th output, $N_F$ is a length of said feedforward filter, and N is a number of communications media in said communication channel;
    decoding a second signal, wherein decoding said second signal comprises comparing said second signal with an output signal of a first feedback module, the first feedback module comprising a multidimensional feedback filter;
    compensating said decoded second signal using a second feedback module; and
    comparing an output signal of said second feedback module with said equalized first signal to calculate said second signal.

2. A method, comprising:
    equalizing a first signal;
    decoding a second signal, the decoding said second signal comprises:
        comparing said second signal with an output signal of a first feedback module, the first feedback module comprising a multidimensional feedback filter,
        calculating metrics corresponding to coder transitions,
        selecting a plurality of symbols corresponding to said transitions,
        updating coder states,
        providing a plurality of symbols survivor paths to a mapper module,
        mapping said survivor paths to a plurality of sets of said plurality of said symbols,
        providing said symbols survivor paths to said first feedback module, and
        processing a plurality of survived symbols for a plurality of decoder states using said first feedback module to compensate for a short-term portion of a communication channel response function;
        wherein said first feedback module comprises an impulse response characteristic defined by:

$$[b_{ij}(1), \ldots, b_{ij}(N_v)]$$

wherein $b_{ij}$ is from a j-th input to an i-th output, and $N_v$ is a length of a Viterbi algorithm survivor path;
    compensating said decoded second signal using a second feedback module; and
    comparing an output signal of said second feedback module with said equalized first signal to calculate said second signal.

3. A method, comprising:
    equalizing a first signal;
    decoding a second signal, wherein decoding said second signal comprises comparing said second signal with an output signal of a first feedback module, the first feedback module comprising a multidimensional feedback filter;
    compensating said decoded second signal using a second feedback module; the compensating said decoded second signal using a second feedback module comprises:
        compensating for a long term portion of a communication channel response function,
        wherein said second feedback module comprises an impulse response characteristic defined by:

$$[b_{ij}(N_v+1), \ldots, b_{ij}(N_B-1)]$$

wherein $b_{ij}$ is from a j-th input to an i-th output, $N_v$ is a length of a Viterbi algorithm survivor path, and wherein $N_B$ is a postcursor intersymbol interference (ISI) impulse response; and
    comparing an output signal of said second feedback module with said equalized first signal to calculate said second signal.

4. A method, comprising:
    equalizing a first signal;
    decoding a second signal, wherein decoding said second signal comprises comparing said second signal with an output signal of a first feedback module, the first feedback module comprising a multidimensional feedback filter;
    compensating said decoded second signal using a second feedback module; and
    comparing an output signal of said second feedback module with said equalized first signal to calculate said second signal, the comparing an output signal of said second feedback module with said equalized first signal to calculate said second signal comprises:
        subtracting an output signal of the second feedback module from said equalized first signal, and
        calculating said second signal according to the following equation:

$$z_i(n) = y_i - \sum_{j=0}^{N} \sum_{k=N_v+1}^{N_B-1} \hat{S}_j(n-k-D_F)b_{ij}(k) \ i = 0, \ldots, N$$

wherein $\hat{S}_j(n)$ represents decoded second signals, $b_{ij}=[b_{ij}(1), \ldots, b_{ij}(N_B-1)]$ is the impulse response characteristic of the second feedback module, $y_i$ is an equalized first signal, $b_{ij}$ is from a j-th input to an i-th output, $N_v$ is a length of a Viterbi algorithm survivor path, $N_B$ is a postcursor intersymbol interference (ISI) impulse response, $D_F$ is a decision delay of a forward filter module, and N is a number of communications media in a communication channel.

5. A method, comprising:
equalizing a first signal;
decoding a second signal, wherein decoding said second signal comprises:
comparing said second signal with an output signal of a first feedback module, the first feedback module comprising a multidimensional feedback filter, the comparing said second signal with an output signal of a first feedback module comprises an output signal defined according to the following equation:

$$u_j^l(n) = z_i - \sum_{j=0}^{N} \sum_{k=1}^{N_v} \hat{S}_j^l(n-k-D_F)b_{ij}(k)$$

$$i = 0, \ldots, N \quad l = 0, \ldots, L$$

wherein $z_i$ is said second signal, j is a number of pair, l is a code state number, N is a number of communications media in a communication channel, $N_v$ is a length of a Viterbi algorithm survivor path, $\hat{S}_j^l(n)$ are symbols of a Viterbi algorithm survivor paths, $D_F$ is a decision delay of a forward filter module, and $b_{ij}$ is from a j-th input to an i-th output;
compensating said decoded second signal using a second feedback module; and
comparing an output signal of said second feedback module with said equalized first signal to calculate said second signal.

6. A system, comprising:
at least one transmitter;
a multiple input multiple output (MIMO) channel to connect said transmitter; and
at least one receiver to connect to said MIMO channel, said receiver to include:
a channel decoder portion comprising a first feedback module in a first feedback loop, the first feedback module comprising a multidimensional feedback filter, and
a channel equalization portion comprising:
a second feedback module in a second feedback loop,
a feedforward filter to receive an input signal from a communication channel and to equalize said input signal, and
a first subtractor module to compare an output signal of a second feedback module of said second feedback loop with an output signal of said channel equalization portion,
said feedforward filter filters said input signal according to the following equation:

$$y_i(n) = \sum_{j=0}^{N} \sum_{k=0}^{N_F-1} x_j(n-k)w_{ij}(k) \quad i = 0, \ldots, N$$

wherein $x_j(n-k)$ is said input signal, $y_i(n)$ is said output signal of said feedforward filter, $w_{ij}$ is an impulse response of said feedforward filter from a j-th input to an i-th output, $N_F$ is a length of said feedforward filter, and N is a number of communications media in a communication channel, wherein said channel equalization portion and said channel decoder portion communicate via said first feedback loop and said second feedback loop to equalize and decode said communication channel.

7. A system, comprising:
at least one transmitter;
a multiple input multiple output (MIMO) channel to connect said transmitter; and
at least one receiver to connect to said MIMO channel, said receiver to include:
a channel decoder portion comprising
a first feedback module in a first feedback loop, the first feedback module comprising a multidimensional feedback filter,
a metrics calculation module to calculate metrics corresponding to coder transitions and to select a plurality of symbols corresponding to said transitions,
an add compare select module in communication with said metrics calculation module to update coder states to provide a plurality of symbols survivor paths,
a first mapper module in communication with said add compare select module to receive said plurality of symbols survivor paths, and
a first feedback module of said first feedback loop in communication with said first mapper to receive said plurality of symbols survivor paths and to process survived symbols of said plurality of symbols survivor paths for a plurality of states of said channel decoder to compensate for a short-term portion of a response function of a communication channel, and
a channel equalization portion comprising a second feedback module in a second feedback loop,
wherein said channel equalization portion and said channel decoder portion communicate via said first feedback loop and said second feedback loop to equalize and decode said communication channel.

8. The system of claim 7, wherein said first feedback module comprises:
an impulse response characteristic defined by:

$$[b_{ij}(1), \ldots, b_{ij}(N_v)]$$

wherein $N_v$ is a length of a Viterbi algorithm survivor path, and $b_{ij}$ is from a j-th input to an i-th output.

9. A system, comprising:
at least one transmitter;
a multiple input multiple output (MIMO) channel to connect said transmitter; and
at least one receiver to connect to said MIMO channel, said receiver to include:
a channel decoder portion comprising
a first feedback module in a first feedback loop, the first feedback module comprising a multidimensional feedback filter,
a metrics calculation module to calculate metrics corresponding to coder transitions and to select a plurality of symbols corresponding to said transitions,
an add compare select module in communication with said metrics calculation module to update coder states to provide a plurality of symbols survivor paths, and
a first mapper module in communication with said add compare select module to receive said plurality of symbols survivor paths;

a channel equalization portion comprising a second feedback module in a second feedback loop, the second feedback module comprises:
the second feedback module in communication with the add compare select module to compensate for a long term portion of a communication channel response function,
wherein said second feedback module comprises an impulse response characteristic defined by:

$$[b_{ij}(N_v+1), \ldots, b_{ij}(N_B-1)]$$

wherein $b_{ij}$ is from a j-th input to an i-th output, $N_v$ is a length of a Viterbi algorithm survivor path, and $N_B$ is a postcursor IS1 impulse response, and
wherein said channel equalization portion and said channel decoder portion communicate via said first feedback loop and said second feedback loop to equalize and decode the communication channel.

10. The system of claim 9, wherein the second feedback loop comprises:
a second mapper in communication with said second feedback module to map decoded data to symbols to provide to said second feedback module.

11. A system, comprising:
at least one transmitter;
a multiple input multiple output (MIMO) channel to connect said transmitter; and
at least one receiver to connect to said MIMO channel, said receiver to include:
a channel decoder portion comprising:
a first feedback module in a first feedback loop, the first feedback module comprising a multidimensional feedback filter, and
a subtractor module to compare an input signal to said channel decoder portion with an output signal of said first feedback module according to the following equation:

$$u_j^l(n) = z_i - \sum_{j=0}^{N} \sum_{k=1}^{N_v} \hat{S}_j^l(n-k-D_F) b_{ij}(k)$$

$$i = 0, \ldots, N \; l = 0, \ldots, L$$

wherein j is a number of pair, l is a code state number, N is a number of communications media in a communication channel, $z_i$ is said second signal, $N_v$ is a length of a Viterbi algorithm survivor path, $\hat{S}_j^l(n)$ are symbols of a Viterbi algorithm survivor paths, $D_F$ is a decision delay of a forward filter module, and $b_{ij}$ is from a j-th input to an i-th output; and
a channel equalization portion comprising a second feedback module in a second feedback loop,
said channel equalization portion and said channel decoder portion communicate via said first feedback loop and said second feedback loop to equalize and decode said communication channel.

* * * * *

UNITED STATES PATENT AND TRADEMARK OFFICE
CERTIFICATE OF CORRECTION

PATENT NO.         : 8,189,705 B2
APPLICATION NO.    : 11/719192
DATED              : May 29, 2012
INVENTOR(S)        : Viktor Ermolayev et al.

It is certified that error appears in the above-identified patent and that said Letters Patent is hereby corrected as shown below:

On sheet 1 of 5, in Figure 1, line 2, delete "Sumbols" and insert -- Symbols --, therefor.

On sheet 3 of 5, in Figure 3, Box 314, line 1, delete "MMO" and insert -- MIMO --, therefor.

In column 14, line 63, in claim 4, delete "$y_i$," and insert -- $y_i$ --, therefor.

In column 17, line 14, in claim 9, delete "IS1" and insert -- ISI --, therefor.

Signed and Sealed this
Twenty-eighth Day of August, 2012

David J. Kappos
*Director of the United States Patent and Trademark Office*